(12) United States Patent
Francois

(10) Patent No.: US 10,039,198 B2
(45) Date of Patent: Jul. 31, 2018

(54) SYSTEM AND METHOD OF USING A RECHARGER PLUG AS A STAND FOR ELECTRONIC DEVICES

(71) Applicant: Bruno Jean-Marie Francois, Atlanta, GA (US)

(72) Inventor: Bruno Jean-Marie Francois, Atlanta, GA (US)

(73) Assignee: EGOS VENTURES INC., Atlanta, GA (US)

( * ) Notice: Subject to any disclaimer, the term of this patent is extended or adjusted under 35 U.S.C. 154(b) by 472 days.

(21) Appl. No.: 14/859,695

(22) Filed: Sep. 21, 2015

(65) Prior Publication Data

US 2016/0014921 A1  Jan. 14, 2016

Related U.S. Application Data

(63) Continuation-in-part of application No. 14/108,737, filed on Dec. 17, 2013, now Pat. No. 9,479,698.
(Continued)

(51) Int. Cl.
*H04N 7/00* (2011.01)
*A47F 5/00* (2006.01)
(Continued)

(52) U.S. Cl.
CPC .......... *H05K 5/0234* (2013.01); *F16M 11/041* (2013.01); *F16M 11/22* (2013.01);
(Continued)

(58) Field of Classification Search
CPC .................................. H04M 1/04; F16M 13/00
See application file for complete search history.

(56) References Cited

U.S. PATENT DOCUMENTS 6,304,284 B1 * 10/2001 Dunton ................. G06T 3/4038
348/36
2011/0104941 A1 * 5/2011 Chang ................ H01R 13/6315
439/530

(Continued)

OTHER PUBLICATIONS

Screen captures from YouTube video clip entitled "IPhone & IPod Easy stand from a charger plug." 4 pages, uploaded on Aug. 1, 2014 by user "grouse2010". Retrieved from Internet: <https://www.youtube.com/watch?v=SZQI7ItD2L8>.*

*Primary Examiner* — Rebecca Volentine
(74) *Attorney, Agent, or Firm* — Gardner Groff Greenwald & Villanueva, PC

(57) ABSTRACT

A charger plug for a smartphone is disconnected from its electrical cord and positioned on its back face with its electrical connector prongs extending upward, then the smartphone is oriented with a side edge facing generally downward and placed on the charger plug on its front face between its electrical connector prongs for use as a stand to stably support the smartphone for use. When standing on the charger in this way, the smartphone can be used for general purposes such a watching videos or it can be used particularly with a software application that automatically controls the smartphone's vibrator to induce hands-free controlled rotation of the smartphone. In typical embodiments, the smartphone and the charger-stand rotate together to compose a panoramic photograph, or for video-conferencing, gaming, or other uses.

16 Claims, 14 Drawing Sheets

Related U.S. Application Data

(60) Provisional application No. 62/055,728, filed on Sep. 26, 2014, provisional application No. 62/053,561, filed on Sep. 22, 2014, provisional application No. 61/861,649, filed on Aug. 2, 2013, provisional application No. 61/748,243, filed on Jan. 2, 2013, provisional application No. 61/738,238, filed on Dec. 17, 2012.

(51) Int. Cl.
*A47F 7/00* (2006.01)
*F16M 11/00* (2006.01)
*F16M 13/00* (2006.01)
*H05K 5/02* (2006.01)
*F16M 11/22* (2006.01)
*F16M 11/04* (2006.01)
*H02J 7/00* (2006.01)
*H04N 5/232* (2006.01)
*H04N 7/14* (2006.01)

(52) U.S. Cl.
CPC ....... *H02J 7/0042* (2013.01); *H04N 5/23216* (2013.01); *H04N 5/23238* (2013.01); *H04N 7/141* (2013.01)

(56) References Cited

U.S. PATENT DOCUMENTS

| | | | | |
|---|---|---|---|---|
| 2011/0187323 | A1* | 8/2011 | Gourley | H02J 5/00 320/111 |
| 2012/0062691 | A1* | 3/2012 | Fowler | F16M 11/10 348/36 |
| 2012/0320148 | A1* | 12/2012 | Unger | H04N 5/23238 348/36 |
| 2013/0181098 | A1* | 7/2013 | Lin | F16M 11/105 248/122.1 |
| 2014/0117193 | A1* | 5/2014 | Wong | F16M 11/10 248/351 |
| 2015/0188591 | A1* | 7/2015 | Shen | H04B 1/3883 455/557 |

\* cited by examiner

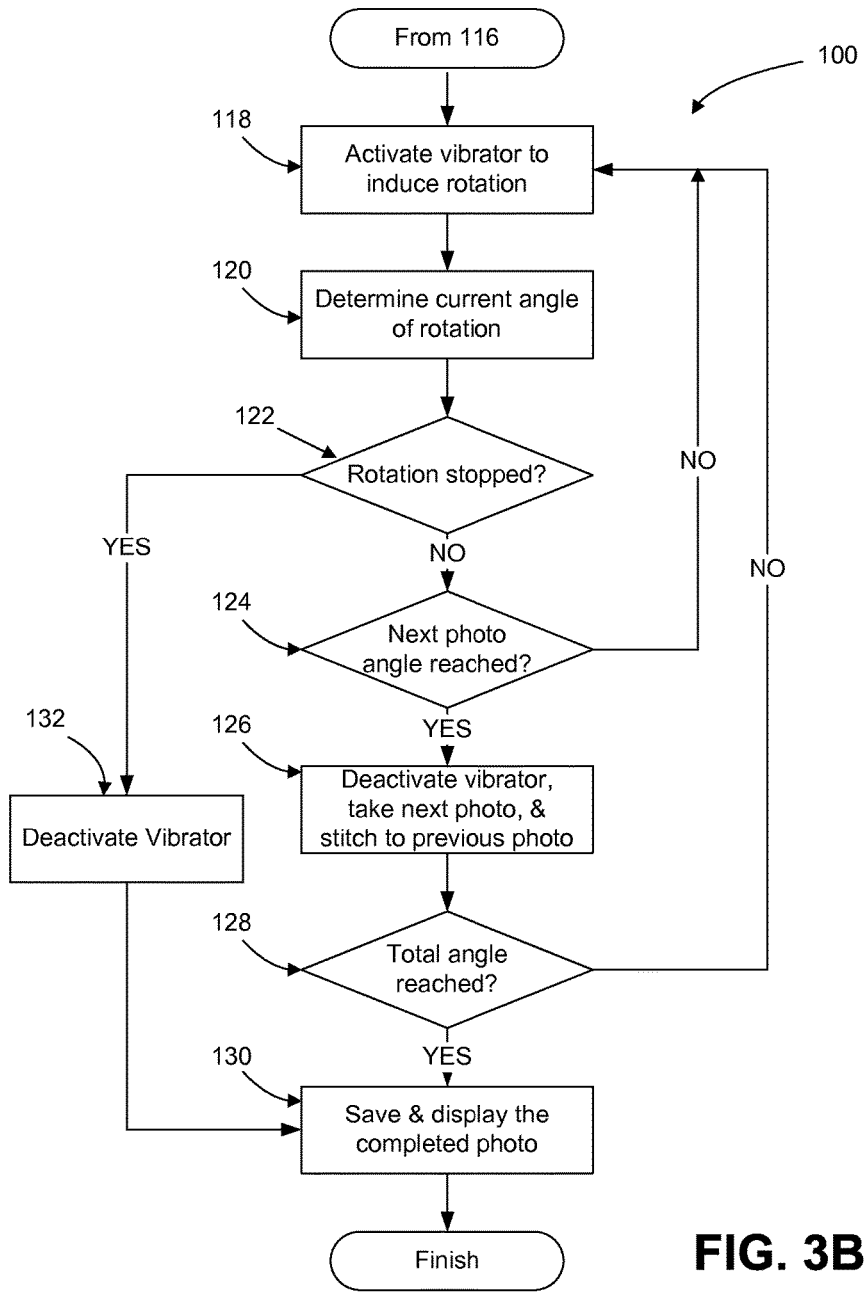

SYSTEM AND METHOD OF USING A RECHARGER PLUG AS A STAND FOR ELECTRONIC DEVICES

CROSS-REFERENCE TO RELATED APPLICATIONS

This application claims the priority benefit of U.S. Provisional Patent Application Ser. No. 62/055,728, filed Sep. 26, 2014, and U.S. Provisional Patent Application Ser. No. 62/053,561, filed Sep. 22, 2014; and is a continuation-in-part of U.S. Non-Provisional patent application Ser. No. 14/108,737, filed Dec. 17, 2013, which claims the priority benefit of U.S. Provisional Patent Application Ser. No. 61/861,649, filed Aug. 2, 2013, U.S. Provisional Patent Application Ser. No. 61/748,243, filed Jan. 2, 2013, and U.S. Provisional Patent Application Ser. No. 61/738,238, filed Dec. 17, 2012, all of which are incorporated herein by reference in there entireties.

TECHNICAL FIELD

The present invention relates generally to photographic equipment, and particularly to camera features on and accessories for portable electronic devices such as smartphones.

BACKGROUND

Many portable electronic devices include a camera for taking photographs and/or videos. Such portable electronic devices include cellular phones, personal email devices, tablet computers, laptop computers, personal digital assistants, and digital cameras. Many such devices include a camera software application that functions to take panoramic photographs using the camera. But to use these applications typically the user must hold the device by hand, so taking seamless panoramic images is not as easy as preferred, particularly when it's desired for the user to be in the photograph. This is in part because a camera experiencing even a little motion takes lower-quality photographs than an immobile camera, so any deviations from the line of the panorama introduces distortions. For a panoramic photo, the software must stitch together multiple pictures, and having the individual photographs taken (1) immobile (except for panoramic rotation), (2) from the exact axial point (to avoid parallax errors when stitching the shots together), and (3) with the same horizontal and vertical orientation (i.e., with rotation in a single plane), are key to getting an optimal result. To ensure these three criteria are met, professional panoramic photographs are usually taken using a tripod and motorized bases. But for casual use, carrying around a tripod is not a practical solution.

Accordingly, it can be seen that there exists a need for improvements for portable electronic devices that make panoramic photographic or video images. It is to the provision of solutions meeting these and other needs that the present invention is primarily directed.

SUMMARY

Generally described, the present invention relates generally to a charger for an electronic device that can be used as a stand (i.e., as a tri-pod) to hold the device in a desired position and particularly to such a charger for use with the electronic device that is loaded with a software application and that has an integral or attached vibrator automatically controls activation of the vibrator to induce hands-free controlled rotation of the device. In typical embodiments, the device is a smartphone with a camera, and the application activates the vibrator to cause the device to rotate to a series of angular positions, activates the camera to take a series of photographs at those positions, and stitch together those photographs into a composite panoramic photograph. The application monitors the angular position of the device based on inputs from motion and/or position sensors of the device. In other embodiments, the application automatically activates the vibrator to induce hands-free rotation of the device for other uses such as video-conferencing, gaming, time-lapse video (the device rotates very slowly, e.g., 5 degrees every 1 minute), or pointing at a specific direction. And in other embodiments, the application activates the vibrator to cue manual rotation of the device by the user for panoramic photography or other uses.

In one aspect, the invention is a software application for implementing vibration-induced rotation of a device. In another aspect, the invention is a device storing a software application for implementing vibration-induced rotation of the device. In another aspect, the invention is a computer-readable media storing a software application for implementing vibration-induced rotation of a device. In another aspect, the invention is a method of activating a vibrator to induce and control rotation of a device. And in yet another aspect, the invention is a method of using a smartphone charger as a stand for holding the smartphone for general use and/or for particular use during vibration-induced rotation of the smartphone.

The specific techniques and structures employed to improve over the drawbacks of the prior devices and accomplish the advantages described herein will become apparent from the following detailed description of example embodiments and the appended drawings and claims.

BRIEF DESCRIPTION OF THE DRAWINGS

FIGS. 3A-3B are a flow diagram of a method of taking a panoramic photograph by the panoramic application and the device of FIG. 1.

DETAILED DESCRIPTION OF EXAMPLE EMBODIMENTS

The present invention relates to controlled rotation of electronic devices by selectively operating a vibrator of the electronic device. In the example embodiments described herein, rotation is controlled as part of a process of making a hands-free panoramic photographic or video image. In other embodiments, rotation is controlled as part of a different process. As such, the scope of the present invention includes numerous implementations of hands-free vibration-induced rotation of electronic devices beyond merely making panoramic images.

For example, in other embodiments the device rotation is controlled as part of a video-conferencing process. In some such video-conferencing embodiments, the device detects the direction of a particular person (e.g., using the camera and facial recognition software), detects the direction from which any audio input is received (e.g., using the microphone), or detects the direction of a specific sound such as a clapping sound or a specific persons voice (e.g., using the microphone). And then the device automatically rotates (hands-free, vibration-induced rotation) and directs the camera in the detected direction (e.g., to the person speaking). In some video-conferencing embodiments, the device rotation can be manually controlled remotely by the person's device on the other side of the conversation.

In yet other embodiments, the device rotation is controlled as part of a gaming process. In some such gaming embodiments, the device rotation is controlled by the users making different specific sounds (e.g., a clap, whistle, or beep), generating different specific vibrations (e.g., tapping once on a table the phone is resting on, or tapping twice), or positioning themselves to in front of a proximity sensor (e.g., located on the front of the device). Thus, the device input components (e.g., microphone, accelerometer, and/or proximity sensor) receive the user-generated sound, vibration, or movement/positioning and then the device automatically rotates (hands-free, vibration-induced rotation) to a predefined angle corresponding to that particular sound or vibration. In some such gaming embodiments, the device rotation is automatically controlled by the device processing and analyzing the camera input (e.g., facial recognition, other biometric features, hand signs, a QR code, or another physical object that is part of the game and can be recognized).

In still other embodiments, the vibration-induced device rotation is controlled as part of a scanning process in which the device creates data files (photographic or other) representing a panoramic view of the environment that can be used for example for 3D modeling. Accordingly, the contemplated scope of the present invention is not limited to vibration-induced rotation of electronic devices for panoramic photography.

Figure 1:
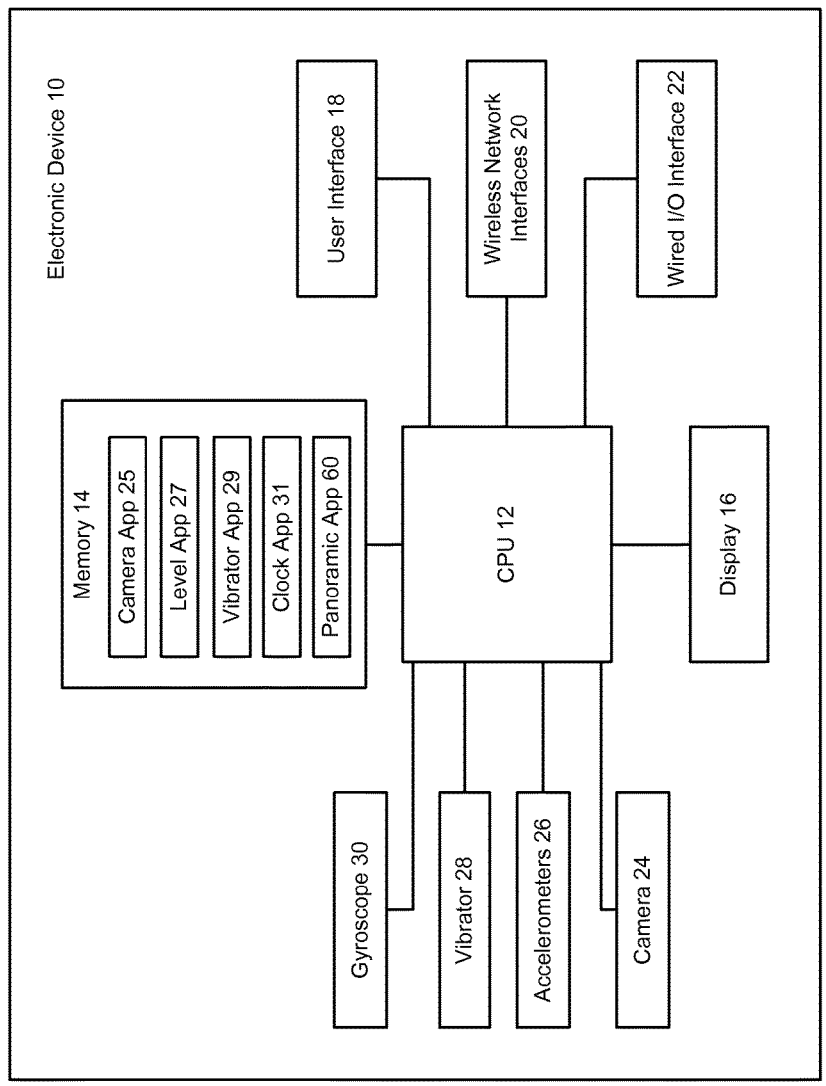
FIG. 1 is a block diagram of an electronic device with a panoramic application according to a first example embodiment of the present invention, showing various internal components of the device.

Referring now to the drawings, FIGS. 1-15 show a portable electronic device 10 with a panoramic application 60 operable to induce rotation of the device in a controlled fashion according to an example embodiment of the present invention. Referring particularly to FIG. 1, the electronic device 10 can be a cellular phone (e.g., the depicted IPHONE smartphone device, or an ANDROID or WINDOWS smartphone device). In other embodiments, the electronic device is a personal email device (e.g., a BLACKBERRY device), a personal media player (e.g., an IPOD device), a tablet computer (e.g., an IPAD device), a laptop computer, a personal digital assistant, a digital camera, or another electronic device.

The electronic device 10 of the depicted embodiment includes at least one central processing unit (CPU) 12, memory storage device 14, display 16, user interface 18, wired input/output (I/O) interface 20, network interface 22, camera 24, accelerometer 26, vibrator 28, and gyroscope 30. These components can be of a conventional and commercially-available type, as is known to persons of ordinary skill in the art. The CPU 12 includes one or more microprocessors, and the microprocessors may be "general purpose" microprocessors, a combination of general- and special-purpose microprocessors, or application-specific integrated circuits (ASICs). Additionally or alternatively, the CPU 12 may include one or more reduced instruction set (RISC) processors, video processors, or related chip sets. The CPU 12 provides processing capability to execute an operating system, run various applications, and/or provide processing for one or more of the processes described herein. Example applications that may run on the electronic device 10 typically include a music player, a video player, a picture displayer, a calendar, an address book, an email client, a telephone dialer, and so forth.

The memory storage device 14 is communicably coupled to the CPU 12 and stores data and executable code. The memory 14 typically includes volatile memory, such as random-access memory (RAM), and nonvolatile memory, such as read-only memory (ROM) or flash memory. In buffering or caching data related to operations of the CPU 12, the memory 14 may store data associated with open applications running on the electronic device 10. Being well-suited to long-term storage, the nonvolatile memory may store software (e.g., for implementing functions on the electronic device 10), data files (e.g., media such as music and video), preference information (e.g., ringtones and media playback preferences), transaction information (e.g., credit-card data and records of transactions), wireless connection information (e.g., wireless network names and passwords, and cellular network connections), subscription information (e.g., a record of subscribed-to podcasts or television shows), and personal information (e.g., contacts, calendars, and email).

The display 16 displays images and/or data to a user. The display 16 may be any suitable display, such as a liquidcrystal display (LCD), a plasma display, or a light-emitting diode (LED) display. In some embodiments, the display 16 includes touch-screen technology through which a user can interface with the electronic device 10.

The user interface 18 may include, for example, indicator lights, user inputs, and/or a graphical user interface (GUI) on the display 18. The user interface 18 operates via the CPU 12 using memory from the memory device 14. The user interface 18 provides interaction with interface elements on the display 16 via certain user-input structures (example described below), user-input peripherals (e.g., a keyboard or mouse), or a touch-sensitive implementation of the display 16. At any given time, one or more applications may be open and accessible to a user via the user interface 18 and/or displayed on the display 16 of the electronic device 10.

The various applications run on the CPU 12 in conjunction with the memory 14, the display 16, and the user interface 18. Instructions stored in the memory 14 or the CPU 12 direct the electronic device 10 to perform certain processes. As such, it should be appreciated that the instructions for carrying out such processes may represent a standalone application, as in this example embodiment, or alternatively they may represent a function of the operating system of the electronic device 10, the hardware of the CPU 12, the memory 14, or other hardware or software of the electronic device.

The network interface 20 provides wireless connectivity for the electronic device 10. The network interface 20 may include, for example, one or more network interface cards (NIC) or a network controller. In some embodiments, the network interface includes a wide-area network (WAN) interface (e.g., for connecting to a cellular data network), a local-area network (LAN) interface 30 (e.g., for connecting to a WI-FI network), and/or a personal-area network (PAN) interface (e.g., for connecting to a BLUETOOTH network).

The wired input/output (I/O) interface 22 typically includes a wired interconnection between the electronic device 10 and another electronic device for additional connectivity. The wired I/O interface 22 may be, for example, a universal serial bus (USB) port or an IEEE 1394 port (e.g., a FIREWIRE port), but may also represent a proprietary connection. Additionally, the wired I/O interface 22 may permit a connection to peripheral user-interface devices, such as a keyboard, a mouse, or headphones.

The camera 24 enables the electronic device 10 to obtain digital photographic and/or video images. In combination with optical character recognition (OCR) software, barcode-reading software, or QR-code-reading software running on the electronic device 10, the camera 24 may be used to input data from printed materials having text or barcode information. And a software application (the camera application) 25 stored on the memory device 14 enables a user to operably control the functionality of the camera 24, for example the shutter speed, zoom, flash, front/rear direction, still/video mode, etc., to obtain, store, and display digital photographic and/or video images. The camera application 25 includes a conventional stitching program that stitches individual photographs together to form a panoramic photograph. Further, the camera application 25 is operable to enable a user to view the stored photographs and videos on the display 16. The camera application 25 can be combined with the panoramic application 60 or provided as a stand-alone application.

The accelerometer 26 and the gyroscope 30 sense the movement and position (i.e., orientation) of the electronic device 10. Typically, one or more accelerometers 26 and one or more gyroscopes 30 provide input regarding the movement and position of the electronic device 10 to certain applications running on the CPU 12. For example, the gyroscope 30 may include a three-axis gyroscope for three-dimensional position/orientation sensing, and the accelerometer 26 may include a three-axis accelerometer (commercially available from ST Microelectronics) that measures forces of acceleration in three dimensions. And a software application (the level application) 27 stored on the memory device 14 interprets data input from the accelerometer 26 and the gyroscope 30 to determine the movement and position of the device 10 relative to all three (X, Y, and Z) axes. Thus, the level application 27 functions to determine whether the device 10 is level (relative to the X and Y axes) and to determine the relative angle of the device (about the Z axis). In this way, the level application 27 is capable of advanced motion sensing such as acceleration, full 3D altitude, and rotation rate. The level application 27 can be combined with the panoramic application 60, provided as a stand-alone application, and/or accessed via the settings. In some embodiments, the device additionally or alternatively includes one or more other position-sensing and/or motion-sensing devices, such as a magnetometer, that provides inputs to the level application 27 for determining the movement and/or position of the device 10. And in other embodiments, the device includes a position-sensing device but not a motion-sensing device, and the level application compares positions of the device 10 to determine its motion.

The vibrator 28 generates an oscillatory motion to produce a vibratory noise. The vibrator 28 is typically used as a setting to notify a user of an incoming communication, whether the speaker is turned off or on. For example, the vibrator 28 may include an eccentric cam rotor an electric rotary motor spinning the eccentric cam, such as the type vibrators that are included in commercially available IPHONE 5 devices. The vibrator 28 causes the device 10 to rotate about its vertical axis in one direction when it is stood upright on a smooth, flat surface. Alternatively, the vibrator may be a linear oscillating vibrator or another type of vibration-generating device that vibrates at a frequency and location that causes the device 10 to rotate about its vertical axis at a generally constant rate in one direction when it is stood upright on a smooth, flat surface. And a software application (the vibrator application) 29 stored on the memory device 14 is operable to turn on and off the notification functionality of the vibrator 28. The vibrator application 29 can be combined with the panoramic application, provided as a stand-alone application, and/or accessed via the settings.

In some embodiments, the vibrator 28 is selected and the vibrator application 29 is programmed to control the rotation (CW or CCW) of the motor of the vibrator to make the device 10 rotate (CW or CCW) in either direction. In other embodiments, one or more additional or alternative vibrators are provided in other portions of the device 10 (or a base, supplemental battery pack, case, or other accessory attached to the device) to induce and control movement of the device in other angular directions (e.g., about a vertical axis when the device is laid flat on its front or back side, or about a horizontal axis when the device is stood upright i.e. in a tilting fashion). And for devices that do not include an integral vibrator, a base, supplemental battery pack, case, or other accessory including one can be provided and attached to the device. As such, reference to the "vibrator 28" herein is intended to include not only vibrators integrally provided in the device 10 but also vibrators in accessories that attach to the device 10 such that their activation induces the device to rotate.

A clock feature is provided by a software application (the clock application) 31 stored on the memory device 14 and operable to provide conventional clock functionality via the user interface 18. Typically, the clock application 31 provides a time/date display as well as functionality for a world clock, an alarm clock (e.g., with interoperability with the vibrator 28), a stopwatch, and a timer. The timer or another feature of the clock application 31 provides a countdown feature by which a countdown can be displayed on the display 16 to a user. The clock application 31 can be combined with the panoramic application, provided as a stand-alone application, and/or accessed via the settings.

In some embodiments, the camera application 25, the level application 27, the vibrator application 29, and the clock application 31 are provided on the device 10 by the manufacturer, and certain needed features of these applications are duplicated in the separate panoramic application 60. This is because some device 10 manufacturers strictly control the original applications and do not allow outside access to the program code. For example, original camera applications 35 typically include a feature operable to stitch together multiple photographs into a single panoramic photograph, and a separate stitching program can be included in the panoramic application 60. In other embodiments, the panoramic application 60 is operable to access the camera application 25, the level application 27, the vibrator application 29, and/or the clock application 31 to use the needed features of them.

Figure 2:
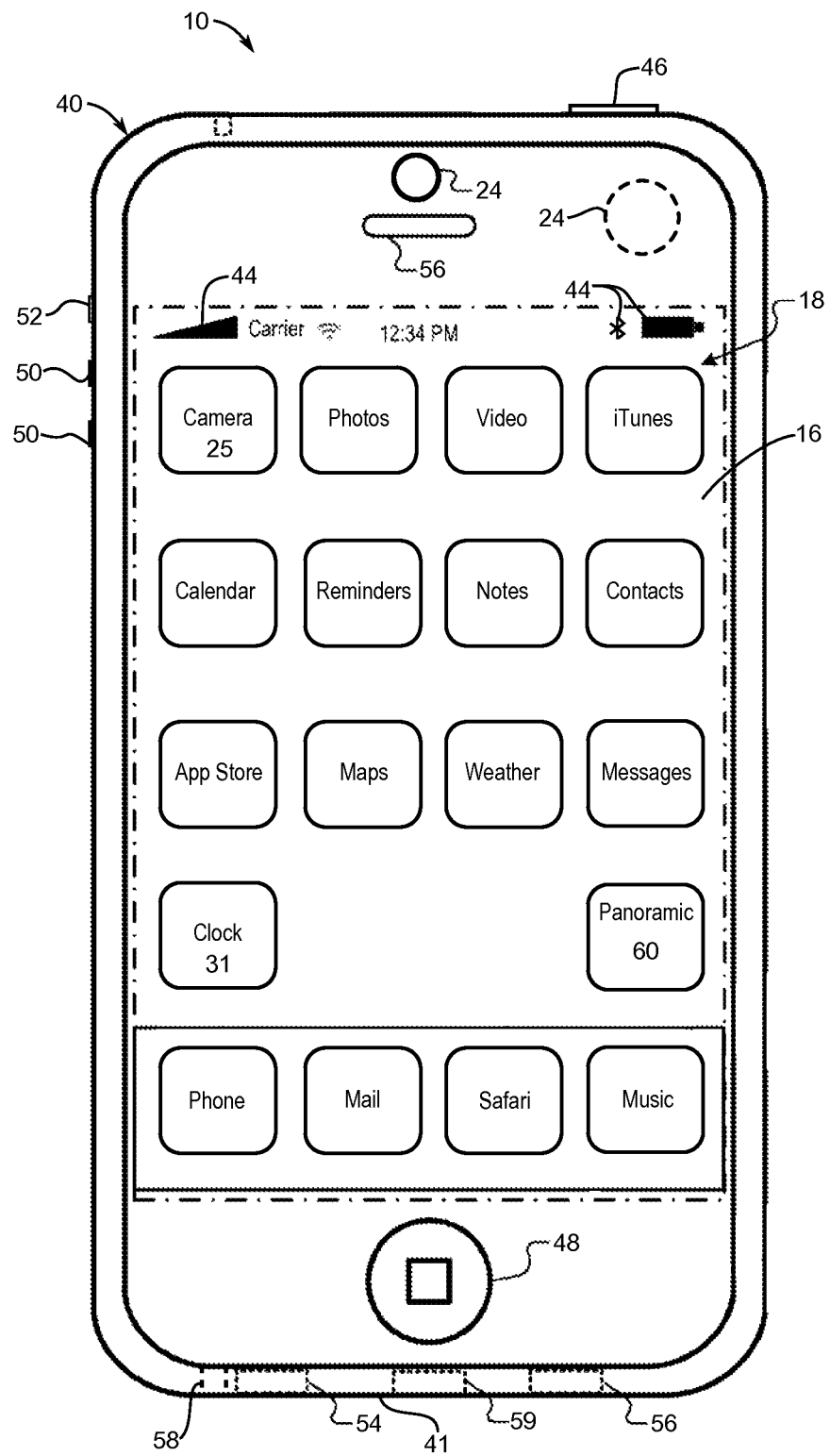
FIG. 2 is a front view of the device of FIG. 1, showing various user interface components of the device.

Referring now to FIG. 2, the electronic device 10 includes an enclosure 40 that protects the internal components of the device 10 from physical damage and electromagnetic interference (EMI), while allow certain frequencies of electromagnetic radiation to pass through the device 40 for wireless communication. The enclosure 40 can be made of plastic, metal, composite materials, other suitable materials, or a combination thereof. The enclosure 40 has a flat bottom edge 41 upon which the electronic device 10 can be stood vertically/upright. In embodiments in which the bottom edge 41 of the enclosure 40 of the device 10 is not flat, a small piece of material (e.g., a mini-tripod as described below) can be provided for attaching (e.g., adhering or clipping, or mechanically connecting) to the enclosure (e.g., the bottom edge, including the charger connector, the headphone jack, or another bottom connector) to make the device stand upright and rotate smoothly and freely. In some embodiments, the device 10 is adapted so that it rotates, under the influence of an internal vibrator, one a side or top edge, in additionally or alternatively to rotating on its bottom edge.

The display 16 of the electronic device 10 may include the user interface 18 in the form of a GUI, which may have a number of individual icons representing applications that can be activated. The user interface 18 on the display 16 may also include certain status indicator icons 44, which may indicate the status of various components of the device 10. For example, the status indicator icons may include a cellular-reception meter, an icon to indicate when the PAN interface 20 is active (e.g., when a BLUETOOTH network is in use), or a battery-life meter.

User-input structures 46, 48, 50, and 52 may supplement or replace the touch-sensitive input capability of the display 16 for interaction with the user interface 18. For example, the user-input structures 46, 48, 50, and 52 may include buttons, switches, a control pad, keys, knobs, a scroll wheel, or any other suitable input structures that work in conjunction with the display 16 to control functions of the device 10. Typically, the user-input structure 46 is an on/off button, the user-input structure 48 is a navigation button for navigating the user interface 18 to a home screen, the user-input structures 50 are a pair of buttons for controlling volume, and the user-input structure 52 is a sliding button that mutes the electronic device 10.

In addition, the electronic device 10 typically includes audio input and/or output structures. For example, audio structures 54 may include one or more microphones for receiving voice data from a user of the device 10. And an audio structure 56 may include and/or one or more speakers for outputting audio data, such as songs, ringtones, sound tracks associated with videos, voice data received by the device 10 over a cellular network, and so forth. In some embodiments, an audio port 58 may also enable connection of peripheral audio input and output devices, such as headsets, speakers, or microphones, for use with the device 10.

Furthermore, a wired (e.g., LIGHTNING or 30-pin dock USB) connector 59 can be provided for charging and/or connecting to other devices. And the camera 24 (phantom-lined) may be located, for example, on the back of the electronic device 10, and a front-facing camera 24 (solid-lined) may also be included.

Having described certain structures and functions of the electronic device 10, systems and methods for inducing hands-free rotation of the device will now be described. In one aspect of the invention, there is provided a software application 60 (also referred to as the CYCLORAMIC application and the panoramic application) that communicates with the camera 24 (directly or via the camera application 25), the accelerometer 26 and the gyroscope 30 (directly or via the level application 27), and the vibrator 28 (directly or via the vibrator application 29). The panoramic application 60 interoperates with these components to induce hands-free rotation of the electronic device 10 about its vertical axis when it is stood upright on its bottom edge 41 to obtain panoramic photographic or video images. The panoramic application 60 is stored in the memory storage 14, runs on the CPU 12, and displays screens on the display 16 via the GUI 18.

With the device 10 stood upright on its bottom edge 41 upon a smooth, flat surface, it is believed that the rotation by the motor of the eccentric cam rotor of the vibrator 28 is in a horizontal plane, so the force of gravity acting on the center of mass of the rotor yields a torque that causes the device to rotate about its vertical axis in one direction. This is believed to result because the torque produces a gyroscopic precessional motion when the torque is applied in the vertical axis of the enclosure 40 of the device 10. Thus, with the device 10 stood upright, activating the vibrator 28 causes the device to rotate about its vertical axis in one direction at a generally constant angular velocity, and when the vibrator is deactivated the device then stops rotating.

As described above, in embodiments in which rotation of the motor of the vibrator 28 can be in either a CW or CCW direction, the panoramic application 29 can be programmed to control the direction of the motor rotation to thereby control the direction of rotation of the device 10 in both the CW and CCW directions. Furthermore, some embodiments include one or more additional vibrators located in other portions of the device 10 and/or in accessories that mount to the device, and the application 29 may control rotation of the motors of such multiple vibrators to control not only rotation of the device 10 about its vertical axis but to additionally induce and control movement of the device in other specific directions (e.g., tilting in a vertical plane, or rotating in a horizontal plane when the device is laid flat on its back side).

Figure 3A:
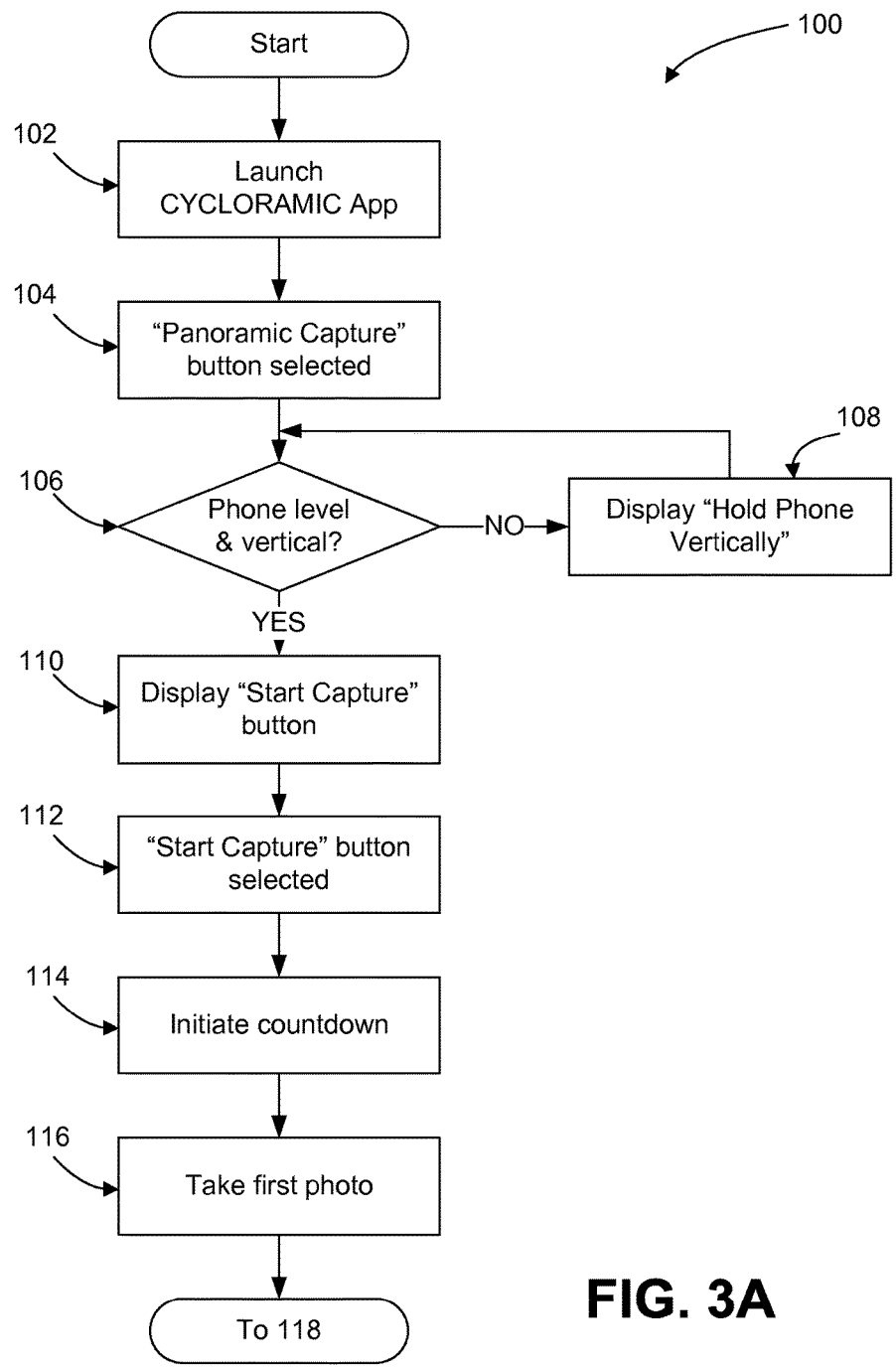

FIGS. 3A-3B show a "hands-free" method 100 of obtaining a panoramic photographic or video image according to an example embodiment of the present invention, and represents the process implemented by the panoramic application 60. FIGS. 4-7 show representative screen displays (e.g., shown on the display 16 via the GUI 18) at several steps of the process 100. And FIGS. 8-13 show representative rotational positions of the device 10 at several steps of the process 100.

The panoramic application 60 can be provided on the device memory 14 as delivered from the manufacturer, downloaded to the device memory from a third-party provider (e.g., from the APP STORE site) via the Internet, or installed on the device memory in another conventional manner. The steps of the method 100 are stored on a computer-readable media (e.g., the device memory 14 or a thumb drive) as instructions for execution by the CPU 12 of the device 10.

Figure 4:
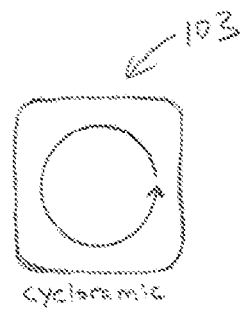
FIG. 4 is a screen display on the device of FIG. 1, showing a representative icon for its panoramic application.
Figure 5:
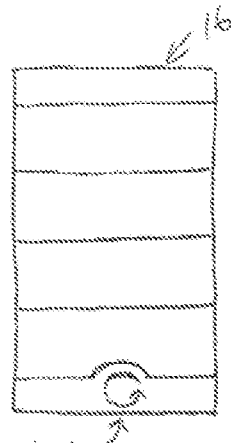
FIG. 5 is a screen display on the device of FIG. 1, showing a representative panoramic capture button displayed by its panoramic application.
Figure 6:
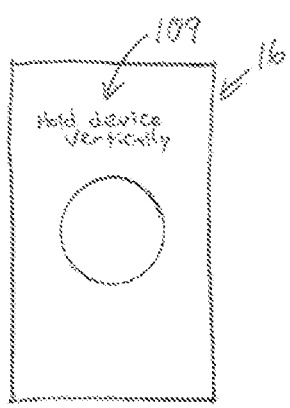
FIG. 6 is a screen display on the device of FIG. 1, showing a representative non-vertical-position indication displayed by its panoramic application.

Details of the "hands-free" panoramic photography method 100 will now be described. First, at step 102 the panoramic application 60 launches in response to a user selecting the corresponding icon shown on the display 16 via the GUI 18. FIG. 4 shows a representative CYCLORAMIC icon 103 on the screen display 16 that is pressed to launch the panoramic application 60 at step 102. At step 104, new panoramic image capture process is initiated in response to a user actuating (e.g., pressing) a panoramic capture button on the display 16 via the GUI 18. FIG. 5 shows a representative screen display 16 with a panoramic capture button 105 at step 104.

Then at step 106 the level application 27 is used to receive initial position information inputs from the motion-sensing and/or position-sensing devices (e.g., the accelerometer 26 and gyroscope 30) and determine if the device 10 is positioned vertically upright and level. If it is not, then at step 108 an indication of that is output to the user. For example, a written message 109 to position the device vertically may be shown on the display 16 via the GUI 18, such as shown in the representative screen display of FIG. 6. If the level application 27 determines that the device 10 is positioned vertically upright and level, then the process proceeds. In some embodiments, if it is determined at step 106 that the device 10 is level, then the process skips ahead to step 114 without further action by the panoramic application 60 or user.

Figure 7:
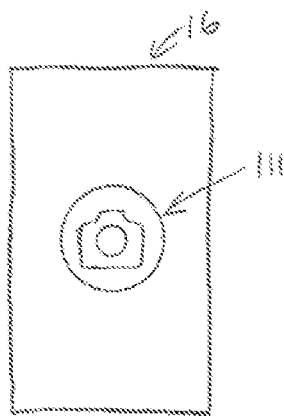
FIG. 7 is a screen display on the device of FIG. 1, showing a representative start button displayed by its panoramic application.

Next, at step 110 an indication to initiate the image capture is output to the user on the display 16 via the GUI 18. FIG. 7 shows a representative screen display 16 with a "start" button 111 at step 110. (The start button can be displayed but inactive (e.g., grayed out), such that pressing it doesn't do anything, until it has been determined that the device 10 is level.) In response to the user actuating (e.g., pressing) the start button at step 112, a countdown (e.g., three seconds) is initiated (e.g., by accessing and using the clock application 31) at step 114, and the countdown may be shown on the display 16 via the GUI 18. The panoramic application 60 may include a settings or preferences feature by which the length of the timed countdown can be user-adjusted to individual preferences. The countdown provides the user with a moment to make sure the camera 24 of the device 10 is aimed where desired to begin taking the panoramic photograph and to step back to get into a desired position for inclusion in the photograph. In some embodiments, the countdown is not included (or at least not displayed), but there is still a brief pause before the process proceeds to the next step.

Figure 8:
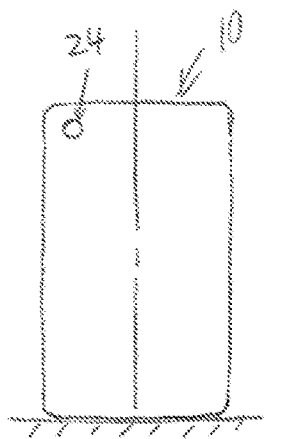
FIG. 8 is a rear view of the device of FIG. 1 in a representative first-photo position taking a first photograph.
Figure 10:
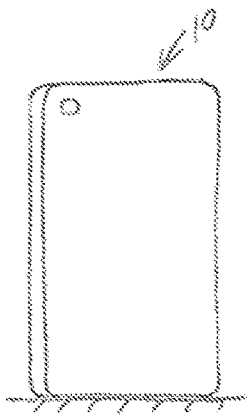
FIG. 10 is a rear perspective view of the device of FIG. 8 rotating from the first-photo position to a next-photo position.
Figure 9:
FIG. 9 is a top view of the device of FIG. 8 in the first-photo position.
Figure 11:
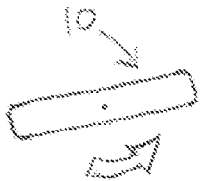
FIG. 11 is a top view of the device of FIG. 10.

At step 116, in response to the countdown reaching zero, the camera 24 is operated to take a first photograph. FIGS. 8-9 show a representative first-photograph position of the device 10 at step 116. Then at step 118 the vibrator 28 is activated (e.g., by communication via the operating system), thereby inducing rotation of the device 10 about its vertical axis (as described above). FIGS. 10-11 show a representative position of the device 10 during the rotation generated by activation of the vibrator 28 at step 118. While the vibrator 28 is on, at step 120 current position information inputs are received from the motion and/or position sensors (e.g., the accelerometer 27 and the gyroscope 30) to determine (e.g., via the level application 27) the current angle of the device 10 relative to its start (first-photograph) position at step 116. And if it is determined that the device 10 stops (or never starts) rotating (e.g., it is not resting on a flat, smooth surface), then the panoramic application 60 can operate to initiate an alert (e.g., a displayed message) to inform a user so corrective action can be taken.

The panoramic application 60 may be set up to produce a pre-defined total angle of rotation, for example, 360 degrees for taking a 360-degree photograph. And the panoramic application 60 may include a settings (i.e., preferences) feature by which the total angle of rotation can be user-adjusted for the individual preference of a user or for a given photograph opportunity. For example, such a settings feature may enable a user to adjust the total angle of rotation to 180 degrees, 270 degrees, or another angle.

In addition, the panoramic application 60 may be set up to take each of the individual photographs used to form the panoramic photograph upon the camera 24 reaching a pre-defined individual-photo angle. For example, the individual-photo angle can be set to provide no more than a 10-percent overlap between the previous and the next photographs. Or the individual-photo angle can be set to provide between a 15-percent and a 25-percent overlap between the previous and the next photographs, such as an about 20-percent overlap. And the panoramic application 60 may include a settings feature by which the individual-photo angle and photograph overlap can be user-adjusted for the individual preference of a user or for a given photograph opportunity.

In addition, the panoramic application 60 includes a stop feature that selectively turns off the vibrator 28 and stops the image-capture process before the device 10 reaches the next individual-photo angle. The stop feature can include a button displayed on the display screen 16 that a user can actuate (e.g., press) to stop the image-capture process before the device 10 reaches the next individual-photo angle. Also, the stop feature can provide for stopping the image-capture process before the device 10 reaches the next individual-photo angle upon the level application 27 determining that the user has displaced the device from substantially upright/vertical and level (e.g., by intentionally or accidentally laying or knocking it down).

Given the pre-defined individual-photo and total angle data, the vibrator 28 continues to vibrate and induce further rotation of the device 10. If at step 122 the stop feature has not been activated before the device 10 reaches the next individual-photo angle, then the vibrator 28 continues to vibrate and induce further rotation of the device 10. And if at step 124 the vibrator 28 deactivates and rotation is stopped before the device 10 reaches the next individual-photo angle, then the process returns to step 118, where the vibrator is reactivated and rotation of the device resumes.

Figure 12:
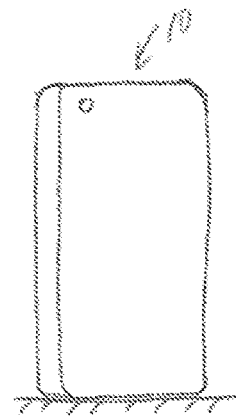
FIG. 12 is a rear perspective view of the device of FIG. 8 rotated to the next-photo position taking a next photograph.
Figure 13:
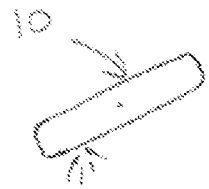
FIG. 13 is a top view of the device of FIG. 12.

In response to the device 10 rotating to the next individual-photo angle (i.e., with the pre-defined photograph overlap), at step 126 the vibrator 28 is deactivated and thus rotation of the device 10 is stopped, and then the camera 24 is operated to take a next photograph and stitch it with the previous photograph to form a panoramic photograph. FIGS. 12-13 show a representative next-photograph position of the device 10 at step 126.

At step 128 the panoramic application 60 then receives current position information input from the motion and/or position sensors (e.g., the accelerometer 27 and the gyroscope 30) to determine (e.g., via the level application 27) if the actual total angle rotated by the device 10 is within a pre-defined range (e.g., within 10 degrees) of the pre-defined total angle. If not, then the process returns to step 118, where the vibrator 28 is reactivated and rotation of the device 10 resumes. The process then continues looping through this vibration-induced rotation and picture-taking routine as needed to complete the panoramic photograph, with each next photograph taken stitched with the previous photograph (with the "previous photograph" including all of the photographs previously taken and stitched together).

But if at step 128 the panoramic application 60 determines that the device 10 has now been rotated to the pre-defined total angle and the last photograph has been taken, then the panoramic photograph has now been completed. As such, the result of this step is the production of a seamless panoramic photograph formed of all of the individual photographs taken and stitched together. In that case, at step 130 the panoramic photograph is stored on the memory 14 (e.g., in a photograph library) and also shown on the display 16. In embodiments in which the device 10 includes a 3-dimensional (3D) viewer, the panoramic photograph can be displayed using the 3D viewer.

In addition, if at step 122 the stop feature has been actuated (e.g., by a user) before the device 10 reaches the next individual-photo angle, then at step 132 the vibrator 28 is deactivated to stop the rotation of the device. From there, the process skips ahead to step 130, where any previous photograph taken is stored and displayed.

At this point, the panoramic photograph process is complete. A user can restart the process at step 104 to take another panoramic photograph, or exit the panoramic application 60 (e.g., by pressing the home button 48 of the device 10).

Figure 14:
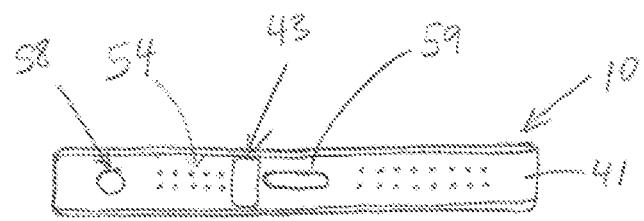
FIG. 14 is a bottom view of the device of FIG. 1, showing a mini-tripod mounted to a bottom side of the device to facilitate smooth and consistent rotation.
Figure 15:
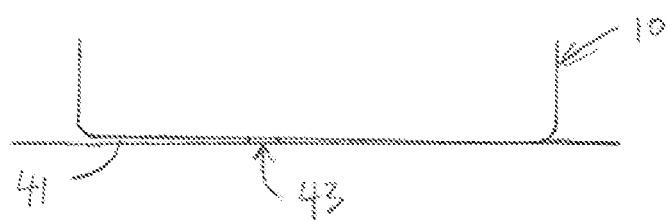
FIG. 15 is a front view of the device with the mini-tripod of FIG. 14.
Figure 16:
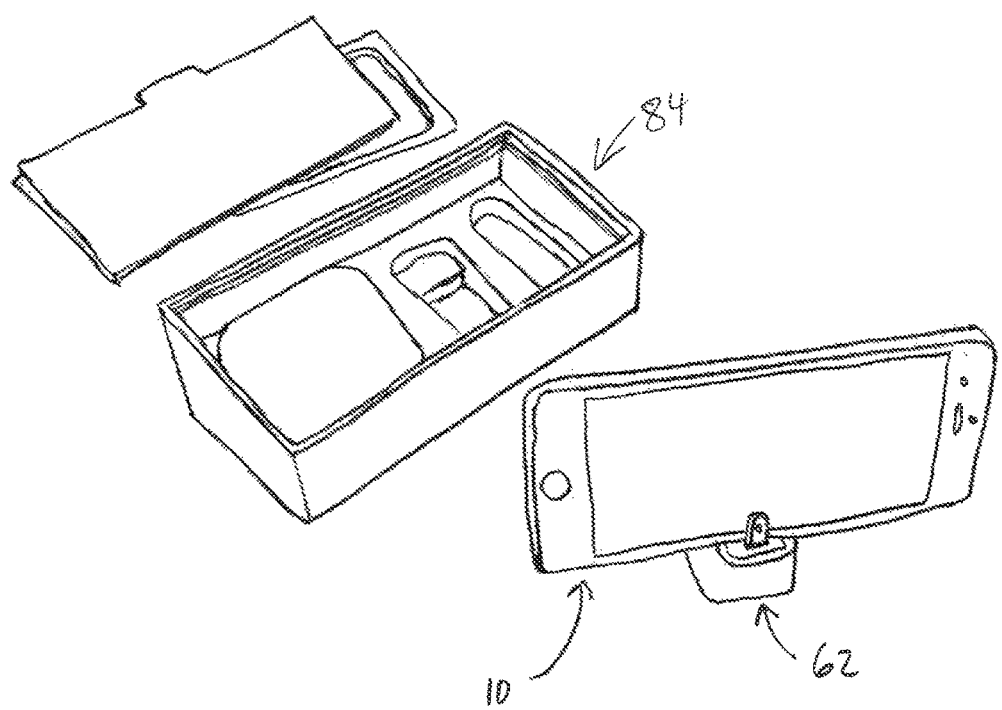
FIG. 16 is a perspective view of an electronic device standing on its charger provided in the same box as the electronic device according to another example embodiment of the present invention.

Having described the example panoramic application 60 for using the vibrator 28 to rotate the electronic device 10, an example method by which a user can use the panoramic application will now be described. As a preliminary step, a user may want to remove any protective cases covering the device so that it will stand vertically upright and level, and thus rotate smoothly and easily. Additionally or alternatively, a user can create a mini-tripod 43 on the bottom edge 41 of the device 10 (or on the corresponding bottom edge of the case) to facilitate smooth and easy rotation. For example, the mini-tripod 43 can be formed by applying a small (e.g., ⅛-inch wide) strip (e.g., a rectangular piece) of several (e.g., four) layers of conventional transparent tape (e.g., SCOTCH tape) to the bottom edge 41 of the device 10, close to its center of gravity. For example, the mini-tripod 43 can be positioned between the lightening connector 59 and the microphone 54 (on the audio-connector 58 side) of an IPHONE 5 device, as depicted in FIGS. 14-15, to improve its rotational performance.

Having prepared the device 10 for use, first a user launches the panoramic application 60 (e.g., by pressing the corresponding icon on the display 16). Unless the previous or default total angle is to be used, the user goes into the settings feature to select the total angle for the panoramic photograph. Then the user positions the device 10 vertically upright on a flat, smooth surface, actuates the image-capture button so the application 60 can ensure the device 10 is vertical and level, and actuates the start button to start the image capture process. The panoramic application 60 proceeds to take a panoramic photograph automatically, with no further action required by the user (i.e., hands-free). Once the image-capture process is complete and the user is satisfied with the panoramic photograph created, the user can repeat the image-capture process to obtain another panoramic photograph or close out the panoramic application 60 when done.

In another embodiment, the panoramic application 60 enables a user to create a panoramic video. In an example method, the panoramic application 60 checks to see whether the camera 24 is in "photo" or "video" mode (as pre-set by a user). If in photo mode, then the process proceeds as described above for producing a panoramic photograph. And if in video mode, then the process proceeds as described above for photo mode, except that the vibrator 28 is not deactivated and reactivated to stop and restart the rotation of the device 10, except that the camera 24 is operated to capture a single video instead of a plurality of photos, and except that the stitching feature is not used. In video mode, the panoramic application 60 deactivates the vibrator 28 to stop the rotation of the device 10 in response to determining that the device has rotated the total angle, or if the device becomes no longer substantially vertical and level (e.g., if it is knocked over or laid down), just as in photo mode.

In another embodiment, the panoramic application 60 is operable to enable a user to create a panoramic photograph in a "guided" mode in which the user holds the device 10 and rotates it manually in response to guidance from the device via the application. This embodiment may be preferred for example for use with a device 10 that does not include a vibrator that produces the desired rotation and/or for use by sight- or hearing-impaired users. Because the user rotates while holding the device 10, the rotation is about the vertical axis of the user (generally speaking), not the vertical axis of the device.

In an example method, the guided-mode process proceeds as described above for photo mode, except that the panoramic application 60 activates an output of the device 10 (e.g., the vibrator 28, an indicator light, or a screen-displayed message or other indicator) to provide a cue to the user that the individual-photo angle has been reached (e.g., as determined by the level application 27) and thus the manual rotation should be stopped. In embodiments in which the cue is not vibration, the panoramic application 60 need not activate the vibrator 28 at any point during the process.

In one guided embodiment, the application 60 operates to display on the display screen 16 two circles moving inward toward each other from the outer side edges of the display screen 16 as the device 10 is manually rotated, when the individual-photo angle has been reached they are superimposed on each other, and the application then displays the cue in the form of a "stop" sign. The application 60 then uses the level application 27 to determine that the manual rotation of the device 10 has in fact been stopped, operates the camera 24 to take a photograph, and redisplays the two circles to prompt further manual rotation. After the photograph is taken, the user then resumes the manual rotation of the device 20 until the next individual-photo angle is reached as indicated by the cue. In some embodiments, the panoramic application 60 does not automatically take the individual photographs, and instead the user manually snaps them upon the cue being provided.

Thus, in the guided mode the user has to hold the device 10 vertically and rotate with the device to take the panoramic photo. So instead of the device 10 rotating automatically using the vibrator 28, the user has to hold the phone and rotate to take the multiple individual photographs for stitching into the panoramic photograph. Thus, this embodiment may include vibratory cues (using the vibrator 28 in a vibration-guided system) and/or audible cues (using the speakers 56 in an auditory-guided system) that allow a user to take a panoramic photograph without even seeing the display screen 16. The cue to stop manual rotation of the device 10 can be the vibration or sound, or the lack of it (i.e., vibration is thus a cue to manually rotate the device).

In an example a vibration-guided embodiment, the user holds the device 10 vertically and level, then initiates (e.g., presses a displayed "go" button) the process. At this point, the panoramic application 60 activates the vibrator 28 to cause the device 10 to start vibrating, indicating that the user needs to slowly rotate (in either direction) the device. Once the panoramic application 60 detects that the individual-photo angle has been reached (e.g., using the level application 27) and the next photograph should be taken, then it deactivates the vibrator 28 so the vibration stops to let the user know to stop the manual rotation and hold still. At this point, the panoramic application 60 operates the camera 24 to automatically take the individual next photograph. Once the photograph has been taken, the panoramic application 60 reactivates the vibrator 28 to indicate to the user to resume the manual rotation (in the same direction) of the device 10. The process is then repeated until the total angle has been reached or until the user decides to stop.

Because the device 10 needs to be held vertical and level during the manual rotation process, the application 60 can operate the vibrator 28 to produce various vibration patterns to warn the user if the device is not held properly. For example, if the device 10 comes out of an allowed range/tolerance from vertical or level during manual rotation by the user, the application 60 can operate the vibrator 28 to produce different vibration patterns to indicate to the user how to reposition the device to get it oriented vertically and level. For example, the different vibration patterns can be one short (e.g., one-half-second long) vibration to indicate that the device 10 needs to be tilted to the left, and two short vibrations to indicate that the device needs to be tilted to the right. Also, if the user rotates the device 10 too fast and past the next individual-photo angle where the next individual photograph was to be taken, the application 60 can operate the vibrator 28 to produce a different vibration pattern to indicate to the user how to reposition the device back to the proper rotational position for taking the next individual photo. For example, the different vibration pattern can be one long (e.g., two-second long) vibration to indicate that the device 10 needs to be rotated in the reverse angular direction.

In addition, the vibration messages may be associated with audible sounds so users have both vibration and sound to be guided. In one embodiment, only the sound cues are activated in a default sound-cue mode, but the vibration cues can be activated in a vibration-plus-sound-cue mode. This combination-cue mode can be a good option for sight-impaired users because of the combination of non-visual cues.

Additional functionality can be provided by the panoramic application 60. For example, a still-to-video feature can be included that enables a user to convert a panoramic photograph into a video (e.g., a 360-degree panoramic photograph to a 15-second movie) by panning across the panoramic photograph, with the resulting video typically being easier to share with others electronic devices than the panoramic photograph itself. In addition, the panoramic application 60 can include a single-shot feature that enables a user to access each of the individual photographs (e.g., 14 individual photographs in a 360-degree panoramic photo) composing the panoramic photograph to process and share them individually. Furthermore, the panoramic application 60 can include an in-application photograph library with storage, editing, and sharing functionality that enables a user to store and edit the panoramic photographs and share them on social media sites such as the FACEBOOK site. Moreover, the panoramic application 60 can include a feature that enables users to edit individual photographs and then re-stitch them together to form an edited panoramic photograph.

In other embodiments, the functionality described herein is implemented in hardware, firmware, a non-standalone software application, a combination thereof, or otherwise. In yet other embodiments, the functionality described herein is implemented by instructions combined into another stand-alone software application, such as the camera application. And in still other embodiments, some of the functionality described herein as being a part of the panoramic application is implemented by instructions that are a part of another standalone software application, such as using the stitching feature of an existing version of the camera application instead of the panoramic application duplicating that same functionality, and/or accessing/using the existing level, vibrator, and/or camera application to communicate with the accelerometer, vibrator, and/or camera instead of communicating with those components directly. And in other embodiments, some of the functionality described herein as being a part of another application is implemented by instructions that are a part of the panoramic application, such as controlling the vibrator or camera directly instead of via their applications.

Having described details of various implementations of the panoramic application 60 and the electronic device 10, some accessories for use therewith will now be described. A levitation device can be provided to support, levitate, and rotate the electronic device 10 loaded with the panoramic application 60. The levitation device includes electromagnets that are operable to levitate it and the supported device 10. While the levitation device is levitating the device 10, the panoramic application 60 operates the vibrator 28 to cause the device and the levitation device to together rotate. In typical embodiments, the levitation device includes a small platform that the device 10 can rest on and a series of electromagnets mounted on the bottom side of the platform, with the electromagnets changing polarity as the platform rotates. The levitation device can be particularly useful in embodiments in which additional vibrators are provided (e.g., in the device 10 or a base, supplemental battery pack, or other accessory attached to it) for inducing rotation of the device in angular directions additional to about its vertical axis.

In addition, a swivel base can be provided that holds the electronic device 10 and includes rotational control elements. The swivel base can be controlled by and in communication with the device 10 by for example a wireless (e.g., BLUETOOTH or WIFI) connection, a wire (e.g., a phone connector or headphone jack), a remote control device (e.g., via IR or RF waves), vibrations (e.g., via an accelerometer), sounds (e.g., via a microphone), and/or a flashlight (e.g., via a light sensor). In an example embodiment, the swivel base is motor-operated and thus includes a motor and power supply (e.g., a battery). In another example embodiment, the swivel base is spring-operated and thus includes a biasing spring (e.g., a torsion, coil, or cantilever/leaf spring), with the swivel base operation being only by spring-loadings. The swivel base may be controlled by the panoramic application 60 or self-controlled (to move slowly without any outside input).

The swivel base can be used to make spherical panoramic images (i.e., to capture the full sphere image) using the device 10 loaded with the panoramic application 60. In one embodiment, the panoramic application 60 is operable to cause the swivel base to rotate 360 degrees, three separate times (i.e., 1080 degrees). For the first turn, the device 10 can be placed on the swivel base and inclined downward (e.g., with the camera facing about 45 degrees below horizontal) to capture the lower part of the sphere. For the second turn, the device 10 on the swivel base can be repositioned vertically upright (i.e., with the camera facing horizontal) to capture the middle part of the sphere (e.g., as is typical when taking a panoramic photograph using the panoramic application 60 described herein). And for the third turn the device 10 on the swivel base can be repositioned so that it is inclined upward (e.g., with the camera facing about 45 degrees above horizontal) to capture the upper part of the sphere. The panoramic application 60 then stitches the three cylinder images into a single spherical panoramic image.

In some embodiments, the electronic device 10 is adapted for rotational control by operating a conventional keyboard.

In another aspect, the invention relates to a stand (i.e., a base or other support) that stably supports the electronic device (effectively functioning as a tri-pod) and works with it to rotate, a system including the stand and the device in an innovative arrangement, and an innovative method of using the stand with the device. Such embodiments can be useful for example for an electronic device having generally rounded edges (e.g., the IPHONE 6 of FIGS. 16 and 19-22) that will not stand up on edge (side or bottom) by itself, as well as for an electronic device having generally squared edges (e.g., the IPHONE 5 of FIGS. 2 and 14-15) that will stand up on edge by itself.

For example, FIGS. 16-22 show a system that includes a charger plug 62 and the electronic device 10 in an innovative arrangement that enables the plug to be innovatively used as a stand for the electronic device. The plug 62 includes a body 64, two male metal electrical connectors or prongs 66 projecting from a first or front face 68 of the body, and a smooth low-friction second or back face 70 opposite the first face.

Figure 17:
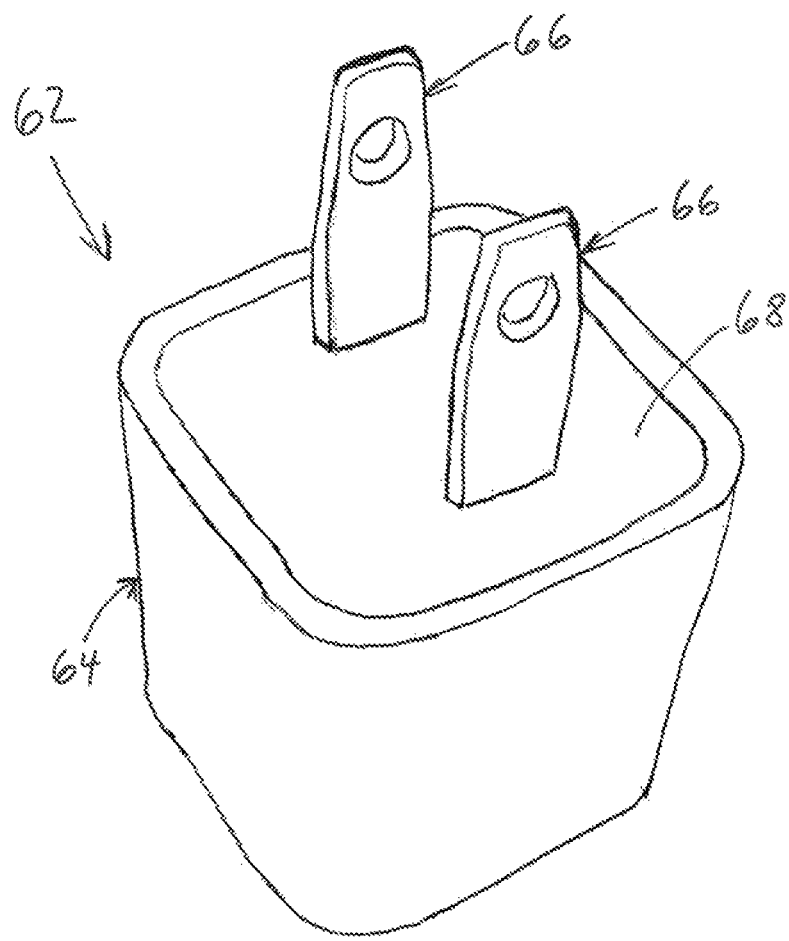
FIG. 17 is a perspective view of the charger of FIG. 16.
Figure 18:
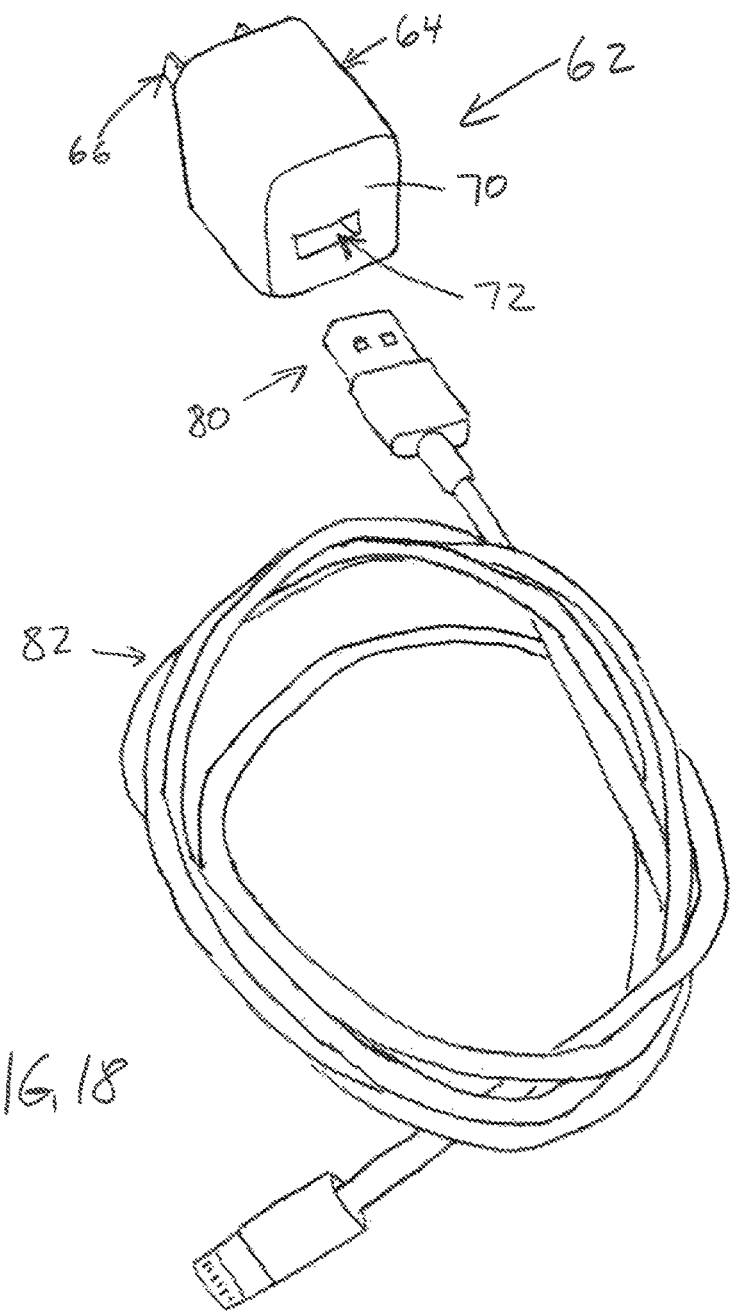
FIG. 18 is a perspective view of the charger of FIG. 16 shown disconnected from its charging cord.
Figure 19:
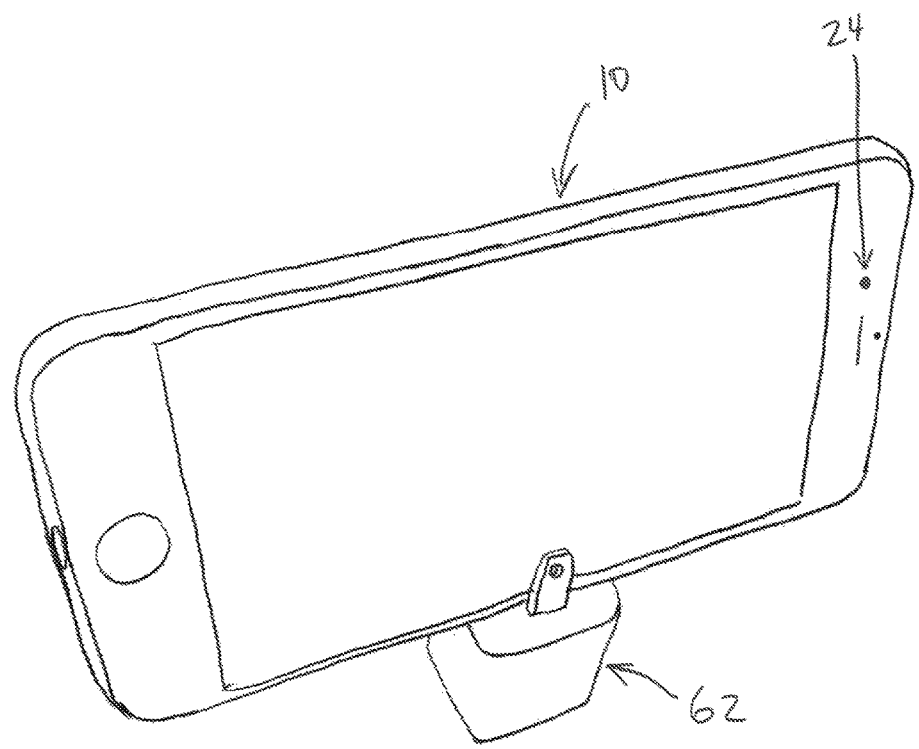
FIG. 19 is a front perspective view of the electronic device and the charger of FIG. 16.

Referring particularly to FIGS. 17-18, the plug body 64 can be generally rectangular (such as the generally cube-shaped body shown), or it can have another regular or irregular shape (such as cylindrical or polygonal). The first and second faces 68 and 70 are typically parallel to each other, thought they need not be precisely parallel so long as the plug body 64 is stable when supporting the electronic device 10. The second face 70 typically includes a female connector (e.g., a female USB connector) 72 for removably receiving a mating male connector (e.g., a male USB connector) 80 of an electrical cable (e.g., a LIGHTNING-to-USB cable) 82, with the second face being sufficiently flat when the electrical cable is removed so that the plug body 64 rests stably on the support surface, though this connector could be positioned on a side of the body. The two male electrical connector prongs 66 of the plug body 64 are matingly receivable in the two female receptacles of a conventional electrical socket, and as such are typically about ⅝-inch long metal prongs with a spacing 74 between opposing parallel inner surfaces 76 of about 7/16 inch (they can have different shapes, sizes, and spacings for use in other countries with different electrical systems). In some embodiments the male electrical connector prongs 66 are fixedly mounted to the plug body 64 and in other embodiments they are pivotally mounted for folding between an extended use position and a retracted storage position.

As such, the charger plug 62 can be of a conventional design for use with conventional electronic devices. In typical embodiments such as that depicted, the charger plug 62 is an IPHONE power adapter Model A1265, which is provided in the box 84 with the IPHONE 6 (see FIG. 16) and the IPHONE 6 PLUS. In this way, the user does not need to purchase a separate stand for use with the electronic device 10, and the plug 62 is small enough (e.g., the plug body 64 about 1"×1"×1¾") that it's easy and convenient for the user to carry around.

In a method of use, and to arrange the components to form the innovative system in order to perform the innovative method of use, the charger plug 62 is first disconnected from the electrical cable 82, if at the time these components are connected. Then the charger plug 62 is placed on a smooth flat support surface (e.g., a countertop or table) with its smooth/low-friction second/back face 70 oriented facing downward (for support) and thus the male electrical connectors 66 extending upward (generally vertically). Then the electronic device 10 is placed onto the first/front (now oriented upward to be the top) face of the plug 62 wedged between the two male metal electrical connector prongs 66 to hold the device on the plug. Typically, the electronic device 10 is oriented with its front face pointing generally horizontally (i.e., with its body in a generally vertical orientation), with one of its side edges 47 facing upwards and with its top edge and its bottom edge 41 generally vertical, so that the camera application 25 can use the camera 24 (or the rear-facing camera) to capture a landscape image.

Figure 20:
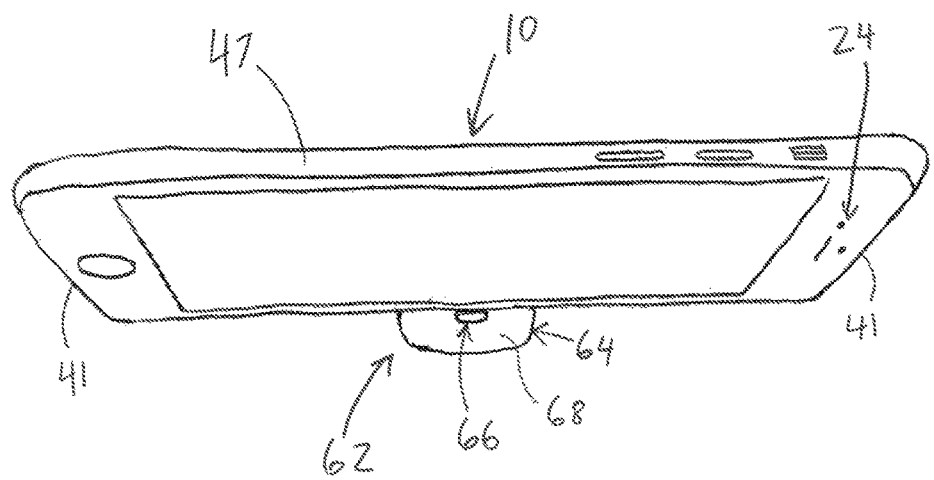
FIG. 20 is a plan view of the electronic device and the charger of FIG. 16.
Figure 21:
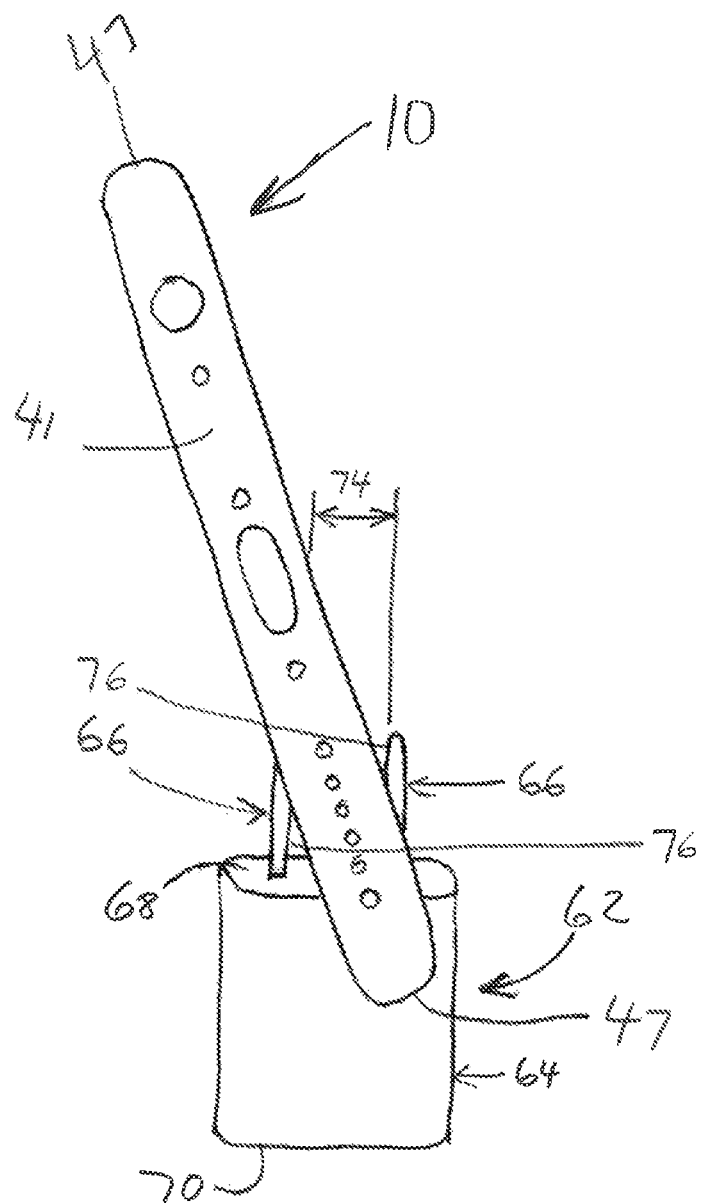
FIG. 21 is a side perspective view of the electronic device and the charger of FIG. 16.
Figure 22:
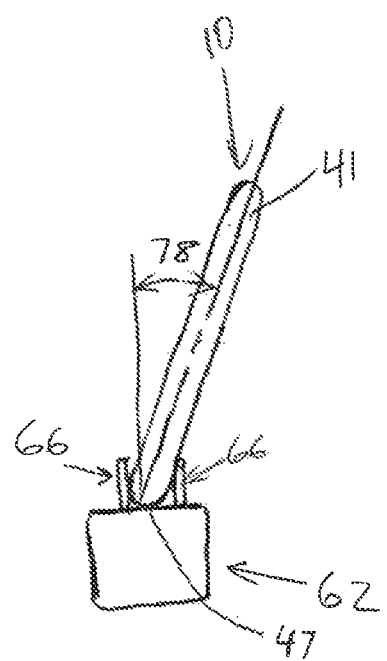
FIG. 22 is a side view of the electronic device and the charger of FIG. 16.

Because the spaced distance 74 between the two male connectors 66 is greater than the thickness of the electronic device 10, the device sits on its side edge 47 within the space between the connectors at an angle 78 from a vertical axis (see FIGS. 20-22). In the depicted embodiment, for example, the electronic device 10 is tilted at an angle from vertical of approximately 20 degrees (see FIG. 22). Because the electronic device 10 is tilted/angled in this way, gravity applies forces from it to the electrical connectors 66, thereby helping to transfer the vibrations from the electronic device to the plug 62, which in turn transfer them to the support surface it is resting on. And because the electronic device 10 is tilted/angled and leaning against a top of one of the male connectors, a moment force is generated that influences the plug body 64 toward tilting backwards (relative to the front and back faces of the electronic device), without causing the plug body to actually tilt/pivot up off the support surface (so the plug and supported electronic device are stable), which enables the plug to rotate on its back edge (given the orientation of the electronic device).

The panoramic application 60 can then be launched to perform a method of obtaining a panoramic image (e.g., any of those methods described herein, or others). Instead of the vibrations from the vibrator 28 being transmitted through the device enclosure 40 and directly to the support surface, the vibrations are additionally transmitted through the plug 62. In particular, due to the rigid materials of the device enclosure 40, the male connectors 66, and the plug body 64, and due to the gravitational forces acting on the device enclosure to bias it against the opposing inner surfaces 76 of the male connectors, the vibrations are transmitted from the device enclosure, through the contacted male connectors, through the plug body, and to the support surface. This results in a vibration-induced rotation of the electronic device 10 along with the charger plug 62 supporting it. This vibration-induced rotation results even for electronic devices 10 having a vibrator 28 that is a linear vibrating motor that does not generate gyroscopic precession effects but still generates asymmetrical forces.

Because of the moment force resulting from the electronic device 10 being tilted/angled, the system (electronic device 10 and charger plug 62) typically rotates along a circular path, of any number of degrees, defined by a center of the back edge of the plug body 62. To account for the electronic device 10 being tilted/angled, the level application 27 can be modified accordingly to eliminate the requirement that the device be positioned vertical and level, if desired and needed for the panoramic application 60 to function properly. It should be noted that the angled electronic device 10 tends to be advantageous for photography by enabling it to be placed on smooth flat support surfaces (e.g., tables and countertops) that are commonly lower than face level (for typical adult humans).

The electronic device 10 can be situated on the charger plug 62 in other ways for use. For example, flipping the electronic device 10 from resting on one side edge 47 to the opposite side edge reverses the angular direction of the system rotation. Also, the electronic device 10 can be reversed on the plug 62 so that its front faces rearward, and the rear-facing camera 24 can be used (opposite from what is shown in FIG. 23). Further, a protective case can be removed from the electronic device 10 before positioning it on the plug 62, or cases that do not add significantly to the overall thickness (so the thickness remains less that the spacing of the connectors 66) can be left on the device, though this may result in a steeper angle and less vibrational transmissivity.

In other embodiments, the charger plug is of a similar type (including a body with two male connectors extending from a first face and a second opposite flat face) provided by another manufacturer and/or for use with another electronic device (e.g., an ANDROID phone or an IPAD MINI). In yet other embodiments, the charger plug includes one or more stabilizer wings (e.g., fixed or pivotal) extending from the body in the plane of the second face for increased stability of the stand when supporting a larger or horizontally-oriented electronic device.

In still other embodiments, a stand for an electronic device is provided that is not a charger plug but includes some common elements that enable it to function as a stand as described herein (so the male elements need not be electrical connectors and need not be metal, and can be in the form of for example plastic panels, plates, tine-sets, or other projections). Such common elements include for example a structure(s) for holding the electronic device on edge (standing up generally vertically or horizontally), structure(s) for transferring vibration from the phone case to the stand, and a smooth low-friction (generally slippery) bottom that enables free rotation. In such embodiments, the male device-holding elements can be spaced apart farther for receiving, retaining, and stably supporting electronic devices that are thicker and/or encased for protection.

In these and other forms, the stand 62 can be used for a range of applications, for example, the stand can be used to support the electronic device 10 for rotation in applications including panoramic photography, video conferencing, and games (e.g., spin the bottle). In some other embodiments, the stand 62 does not transfer vibrations and/or smoothly rotate (e.g., it does not have a rigid part in a forced fit with the electronic device for good energy transfer and/or it does not have a smooth low-friction second surface), or it can include that functionality (e.g., in the charger-plug embodiment disclosed herein) but not use it, to provide for use as a stationary stand for example for viewing videos (e.g., using YOUTUBE) or communicating (e.g., using FACETIME) on the electronic device.

It is to be understood that this invention is not limited to the specific devices, methods, conditions, or parameters of the example embodiments described and/or shown herein, and that the terminology used herein is for the purpose of describing particular embodiments by way of example only. Thus, the terminology used herein is intended to be broadly construed and is not intended to be unnecessarily limiting of the claimed invention. For example, as used in the specification including the appended claims, the singular forms "a," "an," and "the" include the plural, the term "or" means "and/or," and reference to a particular numerical value includes at least that particular value, unless the context clearly dictates otherwise. In addition, any methods described herein are not intended to be limited to the sequence of steps described but can be carried out in other sequences, unless expressly stated otherwise herein.

While the claimed invention has been shown and described in example forms, it will be apparent to those skilled in the art that many modifications, additions, and deletions can be made therein without departing from the spirit and scope of the invention as defined by the following claims.

The invention claimed is:

1. A method of positioning an electronic device on edge for use, comprising the steps of:
   providing a charger plug having a front face, a rear face opposite from the front face, two spaced-apart male electrical connectors extending from the front face, and a female electrical connector in the rear face;
   orienting the charger plug with the rear face facing down;
   positioning the charger plug on a support surface with the rear face resting on the support surface and with the two spaced-apart male electrical connectors extending upward;
   orienting the electronic device with an edge thereof facing generally downward; and
   positioning the electronic device on the front face of the charger plug between the two spaced-apart male electrical connectors, wherein the two spaced-apart male electrical connectors contact and retain the electronic device on the charger plug so that the charger plug is used as a stand that stably supports the electronic device on edge, and
   wherein the electronic device includes a vibrator and a software application that is operable to control the vibrator, and further comprising the step of operating the software application to control the vibrator to induce, rotation of the electronic device and the charger plug.

2. The method of claim 1, wherein the electronic device further includes a camera and the software application further controls the camera, and further comprising the step of operating the software application to control the camera to compose panoramic photographs during rotation of the electronic device and the charger plug.

3. The method of claim 1, wherein the step of positioning the electronic device on the charger plug includes wedging the electronic device between the two spaced-apart male electrical connectors so that the electronic device is angled with respect to a vertical axis.

4. The method of claim 3, wherein the step of controlling the vibrator includes activating the vibrator to generate vibrations that are transmitted to the electronic device enclosure, to the contacting two spaced-apart male electrical connectors, through the charger plug, and to the support surface, wherein the electronic device and the charge plug together rotate on the support surface.

5. The method of claim 3, wherein the step of positioning the electronic device on the charger plug includes leaning the angled electronic device against a top of one of the male connectors thereby generating a moment arm that influences the charger plug toward but not into a pivotal tilt, wherein the step of activating the vibrator of the electronic device induces rotation of the charger plug about an edge thereof.

6. The method of claim 5, wherein the step of activating the vibrator of the electronic device induces rotation of the charger plug about the edge thereof in a generally circular path.

7. The method of claim 1, wherein the step of positioning the electronic device on the charger plug includes wedging the electronic device between the two spaced-apart male electrical connectors so that the electronic device is angled with respect to a vertical axis.

8. The method of claim 7, wherein when the electronic device is resting on the charger plug wedged between the two spaced-apart male electrical connectors, the angle with respect to a vertical axis is about 20 degrees.

9. The method of claim 1, wherein the support surface is smooth and flat.

10. The method of claim 1, wherein the rear back face of the charger plug is generally smooth and low friction.

11. The method of claim 1, further comprising the step of disconnecting an electrical cable from the female connector of the charger plug before the step of positioning the charger plug on the support surface.

12. The method of claim 1, further comprising the step of using the electronic device in a stationary position resting on the charger plug.

13. A method of positioning an electronic device on edge for use, the electronic device having a vibrator and a software application that is operable to control the vibrator, the method comprising the steps of:
  providing a charger plug having a front face, a rear face opposite from the front face, two spaced-apart male electrical connectors extending from the front face, and a female electrical connector in the rear face;
  disconnecting an electrical cable from the female connector of the charger plug;
  orienting the charger plug with the rear face facing down;
  positioning the charger plug on a support surface with the rear face resting on the support surface and with the two spaced-apart male electrical connectors extending upward;
  orienting the electronic device with an edge thereof facing generally downward;
  positioning the electronic device on the front face of the charger plug between the two spaced-apart male electrical connectors, wherein the two spaced-apart male electrical connectors contact and retain the electronic device on the charger plug so that the charger plug is used as a stand that stably supports the electronic device on edge, wherein the electronic device is wedged between the two spaced-apart male electrical connectors so that the electronic device is angled with respect to a vertical axis and leans against a top of one of the male connectors thereby generating a moment arm that influences the charger plug toward but not into a pivotal tilt; and
  operating the software application to control the vibrator to induce rotation of the electronic device and the charger plug, including activating the vibrator to generate vibrations that are transmitted to the electronic device enclosure, to the contacting two spaced-apart male electrical connectors, through the charger plug, and to the support surface, wherein the electronic device and the charge plug together rotate on the support surface, wherein the moment arm influences the rotation of the charger plug to be about an edge of the charger plug.

14. The method of claim 13, wherein the electronic device further includes a camera and the software application further controls the camera, and further comprising the step of operating the software application to control the camera to compose panoramic photographs during rotation of the electronic device and the charger plug.

15. The method of claim 13, wherein the step of activating the vibrator of the electronic device induces rotation of the charger plug about the edge thereof in a generally circular path.

16. The method of claim 13, wherein when the electronic device is resting on the charger plug wedged between the two spaced-apart male electrical connectors, the angle with respect to a vertical axis is about 20 degrees.

* * * * *